(12) United States Patent
Yano et al.

(10) Patent No.: US 6,940,101 B2
(45) Date of Patent: Sep. 6, 2005

(54) LED LAMP

(75) Inventors: Tadashi Yano, Kyoto (JP); Masanori Shimizu, Kyotanabe (JP); Nobuyuki Matsui, Takatsuki (JP); Tatsumi Setomoto, Takatsuki (JP); Tetsushi Tamura, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/721,981

(22) Filed: Nov. 25, 2003

(65) Prior Publication Data

US 2004/0119086 A1 Jun. 24, 2004

(30) Foreign Application Priority Data

Nov. 25, 2002 (JP) ......................................... 2002-340367

(51) Int. Cl.[7] ................................................ H01L 33/00
(52) U.S. Cl. ........................................ 257/98; 257/100
(58) Field of Search ................................ 257/98, 100

(56) References Cited

U.S. PATENT DOCUMENTS 6,340,824 B1 * 1/2002 Komoto et al. ............... 257/99
6,417,019 B1    7/2002 Mueller et al.
2003/0189829 A1   10/2003 Shimizu et al.

FOREIGN PATENT DOCUMENTS

| JP | 05-290818 A | 11/1993 |
| JP | 10-065221 A | 3/1998 |
| JP | 2001-358370 A | 12/2001 |

OTHER PUBLICATIONS

JPO machine translation of JP 5–290,818.*

* cited by examiner

*Primary Examiner*—Jerome Jackson
(74) *Attorney, Agent, or Firm*—Akin Gump Strauss Hauer & Feld, L.L.P.

(57) ABSTRACT

An LED lamp includes at least one LED chip and a wavelength converting portion including a phosphor for transforming the emission of the LED chip into light having a longer wavelength than that of the emission. The LED lamp further includes filtering member. The filtering member is designed such that the spectral transmittance thereof becomes lower in at least a portion of the wavelength range of 550 nm to 605 nm than in the remaining visible radiation range.

16 Claims, 11 Drawing Sheets

LED LAMP

BACKGROUND OF THE INVENTION

1. Field of the Invention

The present invention relates to an LED lamp including a wavelength converting portion with a phosphor.

2. Description of the Related Art

White LED lamps are recently under vigorous research and development as potential replacements for white incandescent lamps. In some of those white LED lamps, the package of a blue LED chip, made of gallium nitride (GaN), is coated with a phosphor such as YAG. In such an LED lamp, the blue LED chip produces an emission with a wavelength of about 450 nm, and the phosphor produces yellow fluorescence with a peak wavelength of about 550 nm on receiving that emission. Eventually, the emission and fluorescence mix with each other, thereby providing white light.

In another type of white LED lamp currently under development, an LED chip that emits an ultraviolet ray is combined with a phosphor that produces red (R), green (G) and blue (B) light rays. In such an LED lamp, the ultraviolet ray that has been radiated from the LED chip excites the phosphor, thereby emitting the red, green and blue light rays. Consequently, white light can also be obtained as a mixture of these light rays.

A bullet-shaped package is extensively used in conventional LED lamps. Hereinafter, such an LED lamp with a bullet-shaped appearance will be described with reference to FIG. 1.

FIG. 1 illustrates a cross-sectional structure for a conventional LED lamp 20 as disclosed in Japanese Patent No. 2998696, for example. As shown in FIG. 1, the LED lamp 20 includes an LED chip 21, a bullet-shaped transparent housing to cover the LED chip 21, and leads 22a and 22b to supply current to the LED chip 21. A cup reflector 23 for reflecting the emission of the LED chip 21 in the direction indicated by the arrow D is provided for the mount portion of the lead 22b. The inner walls (i.e., reflective surfaces) of the cup reflector 23 surround the side surfaces of the LED chip 21 so as to define a predetermined tilt angle with respect to the bottom of the cup reflector 23. The LED chip 21 on the mount portion is encapsulated with a first resin portion 24, which is further encapsulated with a second resin portion 25.

The first resin portion 24 is obtained by filling the cup reflector 23 with a resin material and curing it after the LED chip 21 has been mounted onto the bottom of the cup reflector 23 and then has had its cathode and anode electrodes electrically connected to the leads 22a and 22b by way of wires. A phosphor 26 is dispersed in the first resin portion 24 so as to be excited with the light. A that has been emitted from the LED chip 21. The excited phosphor 26 produces fluorescence (which will be referred to herein as "light B") that has a longer wavelength than the light A. This LED lamp 20 is designed such that if the light A radiated from the LED chip 21 is for example, red, then the light B emitted from the phosphor 26 is yellow. A portion of the light A is transmitted through the first resin portion 24 including the phosphor 26. As a result, light C as a mixture of the light A and light B is used as illumination light. The light A may also, for example, exhibit a narrow-band spectral distribution with a peak wavelength of about 470 nm, while the light B may exhibit a broad-band spectral distribution with a peak wavelength of about 570 nm, for example.

The conventional LED lamp shown in FIG. 1, however, does not have good color rendering properties. FIG. 2 shows an exemplary spectral distribution of a white LED lamp having the configuration shown in FIG. 1. As can be seen from FIG. 2, the quantity of light emitted from such a white LED lamp in the red wavelength range is significantly lower than in the other wavelength ranges. Thus, such a white LED lamp exhibits deteriorated color rendering properties in that red wavelength range.

The "color rendering properties" is a general expression for the effect of an illuminant on the color appearance of an object that is illuminated by the illuminant. The color rendering properties of an illuminant may be evaluated by its average color rendering index Ra. That is to say, the higher the Ra index of an illuminant, the better the color rendering properties thereof.

According to ISO 8895:1989, illuminants with average color rendering indices Ra of 90 or more are classified as Group 1A, while illuminants with average color rendering indices Ra of 80 to less than 90 are classified as Group 1B. A preferred average color rendering index Ra of an illuminant is changeable with the specific application of the illuminant but is normally at least 70.

However, depending on the color of the light to be provided, it is often hard for the conventional white LED lamp including a blue LED chip to achieve an average color rendering index Ra of 70 or more.

SUMMARY OF THE INVENTION

In order to overcome the problems described above, preferred embodiments of the present invention provide an LED lamp with improved color rendering properties.

An LED lamp according to a preferred embodiment of the present invention preferably includes at least one LED chip and a wavelength converting portion (i.e., wavelength shifter) including a phosphor for transforming the emission of the LED chip into light having a longer wavelength than that of the emission. The LED lamp further includes filtering means, which is designed such that the spectral transmittance thereof becomes lower in at least a portion of the wavelength range of 550 nm to 605 nm than in the remaining visible radiation range.

In one preferred embodiment of the present invention, the LED chip preferably radiates the emission of which a peak wavelength is included in the range of 400 nm to 490 nm.

In another preferred embodiment, the LED chip is preferably mounted on a substrate.

In this particular preferred embodiment, the LED chip is preferably flip-chip bonded to the substrate.

In another preferred embodiment, the wavelength converting portion is preferably made of a resin.

In a specific preferred embodiment, the wavelength converting portion preferably has a cylindrical shape and covers the LED chip entirely.

In that case, the wavelength converting portion is preferably further covered with another resin.

In still another preferred embodiment, the filtering means is preferably arranged so as to cover the wavelength converting portion.

In yet another preferred embodiment, the filtering means is preferably made of a resin.

In yet another preferred embodiment, the wavelength converting portion and the filtering means are preferably both made of the same resin and substantially no interface is preferably present between the wavelength converting portion and the filtering means.

In yet another preferred embodiment, the wavelength converting portion made of the resin preferably includes an Nd compound, and preferably functions as the filtering means as well.

In this particular preferred embodiment, the wavelength converting portion preferably has a cylindrical shape and preferably covers the LED chip entirely.

Alternatively or additionally, the LED lamp may further include a reflector that has an opening surrounding the wavelength converting portion.

In yet another preferred embodiment, the filtering means is preferably designed such that the spectral transmittance thereof becomes lower in the wavelength subrange of 575 nm to 590 nm than in the remaining visible radiation range.

Specifically, the spectral transmittance of the filtering means in the wavelength subrange of 575 nm to 590 nm is preferably controlled to be 10% to 95% of the spectral transmittance thereof in the remaining visible radiation range.

In yet another preferred embodiment, the spectral transmittance of the filtering means is preferably controlled so as to increase the average color rendering index Ra of the LED lamp.

In yet another preferred embodiment, the LED lamp preferably has a card shape so as to be attachable to, or removable from, an illumination unit including a lighting circuit.

According to various preferred embodiments of the present invention, a filtering member, which exhibits a selectively decreased spectral transmittance in a particular wavelength subrange, is applied to an LED lamp, thereby increasing the average color rendering index Ra of the LED lamp.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

The present inventors carried out the following simulations to find a spectral distribution that could effectively contribute to increasing the average color rendering index Ra of an LED lamp.

Those simulations were done on the supposition that the light radiated from an LED chip had a narrow-band spectral distribution with a peak wavelength of about 460 nm and that the light radiated from a phosphor had a broad-band spectral distribution with a peak wavelength of about 575 nm. An LED lamp was designed such that the illumination light, obtained as a mixture of the light radiated from the LED chip (which will be referred to herein as the "emission" of the LED chip) and the light radiated from the phosphor (which will also be referred to herein as the "fluorescence"), had a color temperature of about 4,000 K. Then, the spectral distribution of the illumination light was actually measured on a wavelength range of 380 nm to 780 nm (i.e., the visible radiation range) with the measuring wavelength changed at a step of 5 nm. As a result, 81 data points were obtained and the average color rendering index Ra was approximately 70.

Next, the spectral distribution data thus collected was used to calculate how the average color rendering index Ra would change if the spectral transmittance in a wavelength subrange with a narrow width of 5 nm was decreased to 0%. More specifically, one measuring subrange with a width of 5 nm was selected from the spectral distribution data (81 points) that had been obtained by actual measurement, and the average color rendering index Ra was calculated with the spectral transmittance in the selected subrange decreased to 0%. The same operation was sequentially carried out on the entire visible radiation range of 380 nm to 780 nm.

Figure 3:
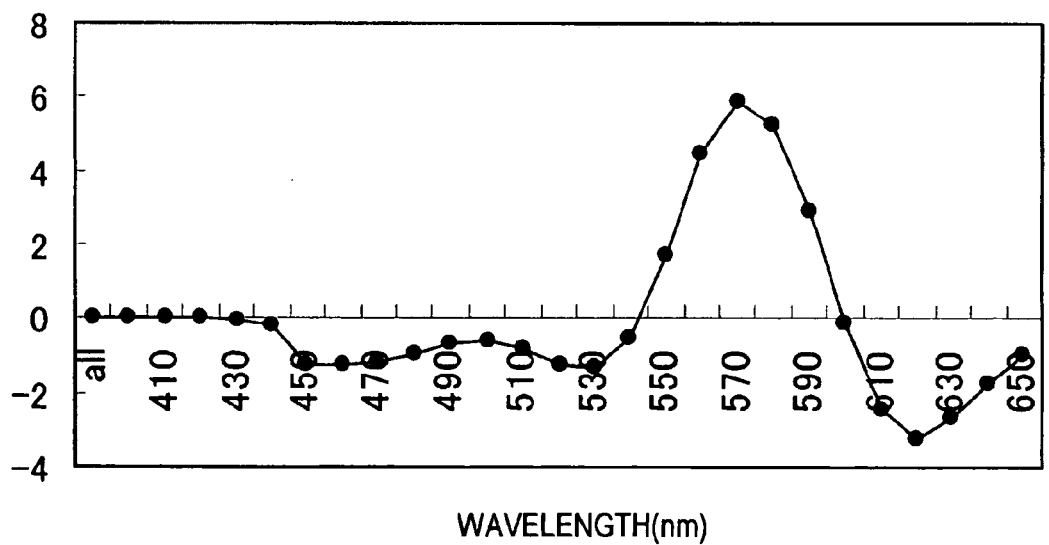
FIG. 3 is a graph showing how the average color rendering index Ra changes with a particular wavelength subrange under measurement, which is selected from 81 data points representing a spectral distribution and in which the spectral transmittance is decreased to 0%.

FIG. 3 is a graph showing the results of the calculations. In FIG. 3, the abscissa represents the center value of the narrow wavelength subrange (with the width of 5 nm) in which the spectral transmittance was decreased to 0%, and the ordinate represents the increase and decrease in average color rendering index Ra. The increase and decrease in average color rendering index Ra were calculated by reference to the average color rendering index Ra of the illumination light that was directly obtained from the LED lamp without being passed through any filter.

In the graph shown in FIG. 3, results of calculations had a peak at a wavelength of about 570 nm. In this case, the data point at a wavelength of $\lambda$ nm refers to a variation in the average color rendering index Ra of the illumination light when the spectral transmittance in the wavelength subrange of $(\lambda-2.5)$ nm to $(\lambda+2.5)$ nm was decreased to 0%.

As can be seen from the results shown in FIG. 3, if the spectral transmittance in a particular wavelength subrange to be arbitrarily selected from the wavelength range of 550 nm to 605 nm is decreased from the intentionally non-decreased spectral transmittance in a reference wavelength subrange (e.g., a spectral transmittance at a wavelength of 510 nm), then the average color rendering index Ra of the LED lamp increases. In particular, the average color rendering index Ra can be increased effectively by decreasing the spectral transmittance in the wavelength subrange of 575 nm to 590 nm. The spectral transmittance may be controlled in this manner by using a filtering member with appropriate transmittance characteristic. Japanese Laid-Open Publication No. 5-290818 discloses a technique of absorbing yellow light (with a wavelength of 570 nm to 590 nm) by adding neodymium oxide to the inside space of a glass tubular light bulb for use as an inner light for a refrigerator, for example. However, this technique has the disadvantage that items stored in a refrigerator can look brighter in colors but will have a decreased average color rendering index Ra.

Hereinafter, it will be described how the average color rendering index Ra and luminous flux of an LED lamp change with the transmission characteristic of a filtering member adopted.

Filtering Member F1

Figure 4A:
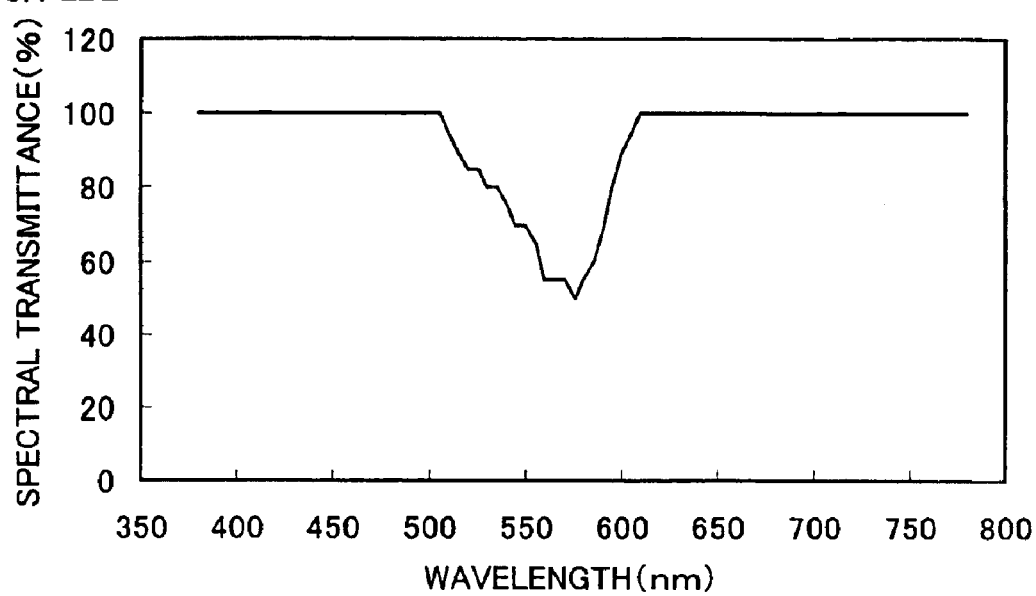
FIG. 4A is a graph showing the spectral transmittance of a filtering member F1 that may be used in an LED lamp according to a preferred embodiment of the present invention.
Figure 4B:
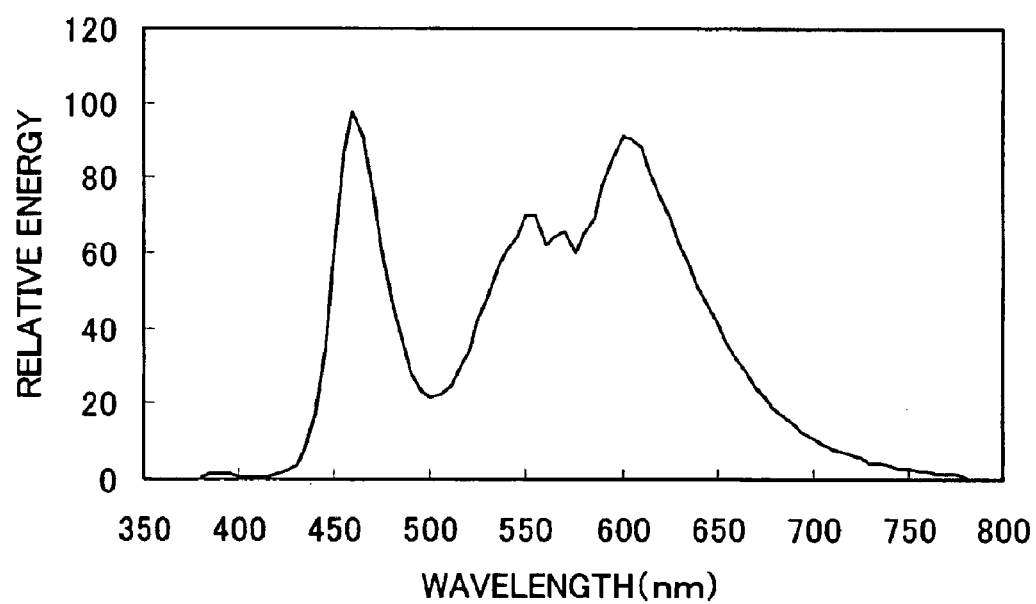
FIG. 4B is a graph showing the spectral distribution of light emitted from the LED lamp including the filtering member F1.

First, a filtering member F1 will be described with reference to FIGS. 4A and 4B. FIG. 4A shows the spectral transmittance of the filtering member F1, and FIG. 4B shows the spectral distribution of light emitted from an LED lamp including the filtering member F1.

As can be seen from FIG. 4A, the spectral transmittance of the filtering member F1 is lower in the wavelength subrange of more than 510 nm to 605 nm than in the other wavelength subranges (e.g., at a wavelength of 510 nm).

The LED lamp including such a filtering member F1 had an average color rendering index Ra of 68. On the other hand, when the filtering member F1 was not used (i.e., when the filtering member F1 was replaced with a transparent member exhibiting a spectral transmittance of 100% in the entire visible radiation range), the resultant average color rendering index Ra was 65. That is to say, the average color rendering index Ra could be increased by 3 by using the filtering member F1. Also, the luminous flux of the LED lamp with such a filtering member F1 decreased to 72% of that of the LED lamp without the filtering member F1.

In this manner, by using a filtering member that has a lower spectral transmittance in the wavelength subrange of more than 510 nm to 605 nm than the spectral transmittance at a wavelength of 510 nm, the average color rendering index Ra of the LED lamp can be increased.

As can be seen from the results shown in FIG. 3, the average color rendering index Ra of an LED lamp can be increased particularly significantly by selectively decreasing the spectral transmittance in the wavelength subrange of 550 nm to 605 nm as described above. On the other hand, in the transmittance characteristic shown in FIG. 4A, the spectral transmittance is decreased in a broader wavelength subrange of more than 510 nm to 605 nm, including the subrange of 550 nm to 605 nm, than in the remaining visible radiation range. In this case, even if the spectral transmittance is decreased in the subrange of more than 510 nm to less than 550 nm, the average color rendering index Ra would not be increased so effectively. However, if the spectral transmittance is decreased in the wavelength subrange of 550 nm to 605 nm, the average color rendering index Ra should be increased significantly.

It should be noted that the wavelength subrange in which the spectral transmittance is decreased should not be expanded excessively to avoid a decrease in luminous flux. In particular, a light ray with a wavelength of 550 nm belongs to a green wavelength range in which the luminosity achieved is relatively high. Accordingly, the spectral transmittance at a wavelength of 550 nm is preferably kept relatively high, while at the same time, the spectral transmittance in the subrange of 550 nm to 605 nm is preferably decreased selectively. The wavelength subrange in which the spectral transmittance is decreased is preferably selected from the range of 550 nm to 605 nm. However, the spectral transmittance may also be decreased in any other wavelength subrange.

Also, in the specific example described above, a blue LED with an emission peak wavelength of about 460 nm is used as the LED chip. Speaking more generally, though, the effects of the present invention are achievable particularly remarkably with an LED chip that has an emission peak wavelength of 400 nm to 490 nm.

Filtering Member F2

Figure 5A:
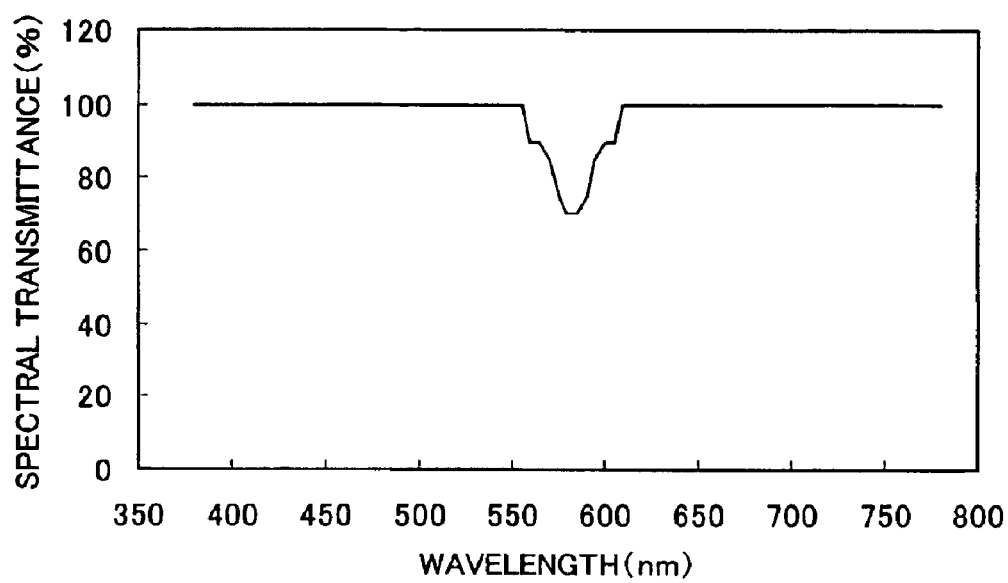
FIG. 5A is a graph showing the spectral transmittance of a filtering member F2 that may be used in an LED lamp according to another preferred embodiment of the present invention.
Figure 5B:
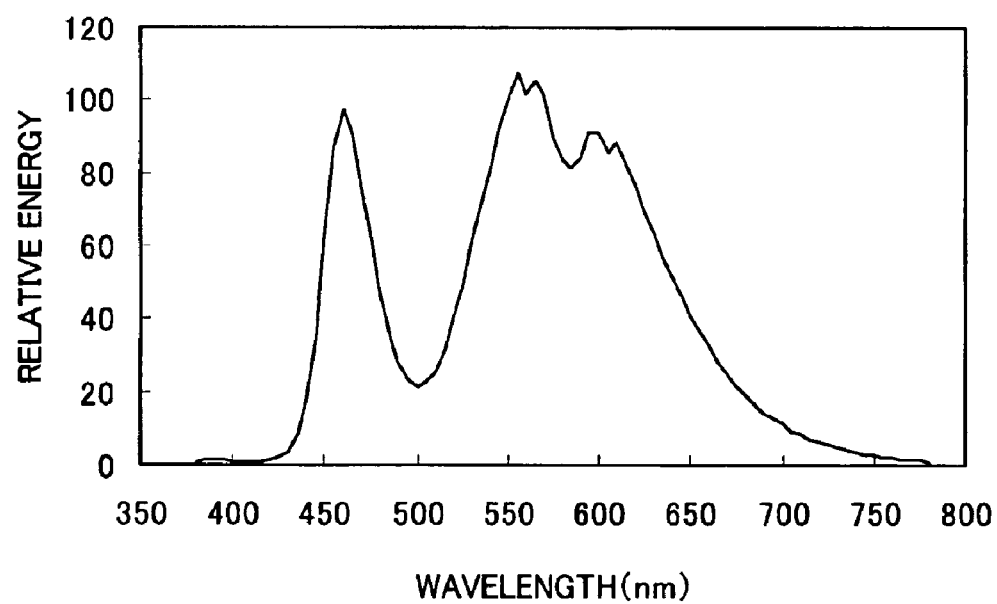
FIG. 5B is a graph showing the spectral distribution of light emitted from the LED lamp including the filtering member F2.

Next, another filtering member F2 will be described with reference to FIGS. 5A and 5B. FIG. 5A shows the spectral transmittance of the filtering member F2, and FIG. 5B shows the spectral distribution of light emitted from an LED lamp including the filtering member F2.

As shown in FIG. 5A, the spectral transmittance of the filtering member F2 decreased in the wavelength subrange of 560 nm to 605 nm from the spectral transmittance at a wavelength of 510 nm. When such a filtering member F2 was used, the average color rendering index Ra increased to 72 and the luminous flux decreased to 90%.

In this manner, by using a filtering member that has a lower spectral transmittance in the wavelength subrange of 550 nm to 605 nm than the spectral transmittance at a wavelength of 510 nm, the average color rendering index Ra of the LED lamp can be increased efficiently with the decrease in the luminous flux thereof minimized.

Filtering Member F3

Figure 6A:
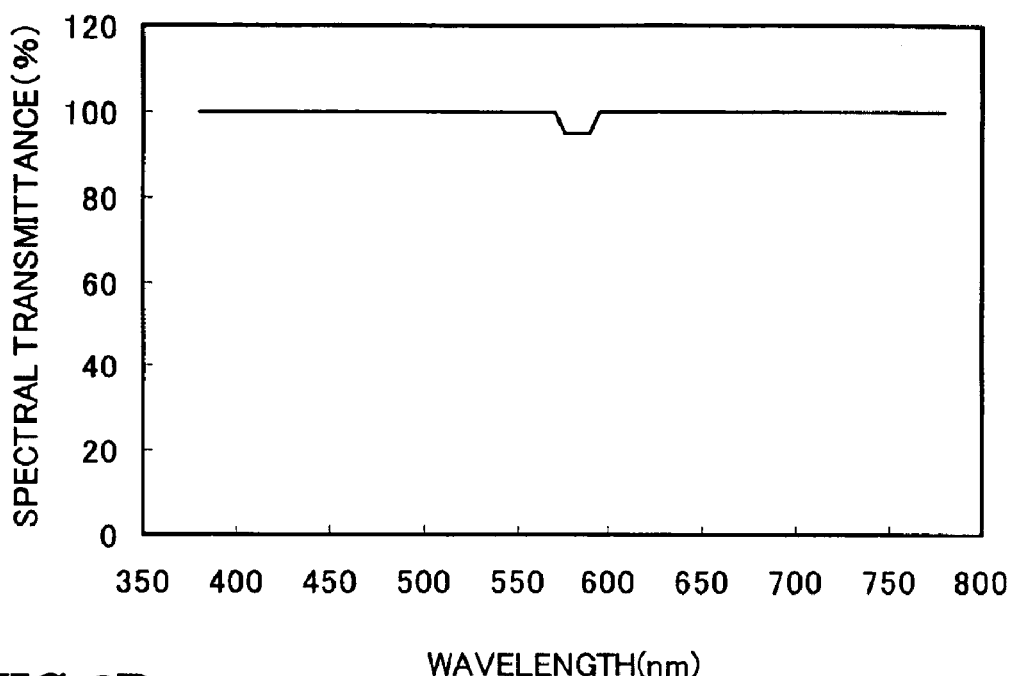
FIG. 6A is a graph showing the spectral transmittance of a filtering member F3 that may be used in an LED lamp according to still another preferred embodiment of the present invention.
Figure 6B:
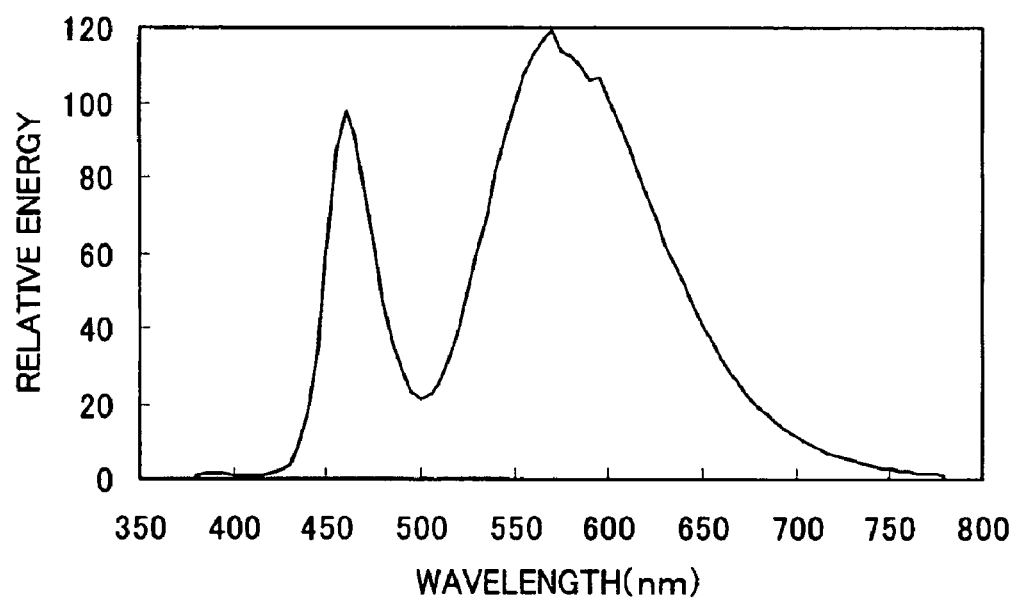
FIG. 6B is a graph showing the spectral distribution of light emitted from the LED lamp including the filtering member F3.

Next, another filtering member F3 will be described with reference to FIGS. 6A and 6B. FIG. 6A shows the spectral transmittance of the filtering member F3, and FIG. 6B shows the spectral distribution of light emitted from an LED lamp including the filtering member F3.

As can be seen from FIG. 6A, the spectral transmittance of the filtering member F3 in the wavelength subrange of 575 nm to 590 nm was approximately 95% of its spectral transmittance in the other wavelength subranges (e.g., at a wavelength of 510 nm). When such a filtering member F3 was used, the average color rendering index Ra slightly increased to 66, and the luminous flux was approximately 99% of the luminous flux obtained by using no filtering member F3.

In this manner, even by using a filtering member that has its spectral transmittance decreased just slightly by 5% in the wavelength subrange of 575 nm to 590 nm from the spectral transmittance at a wavelength of 510 nm, the average color rendering index Ra of the LED lamp can also be increased.

Filtering Member F4

Figure 7A:
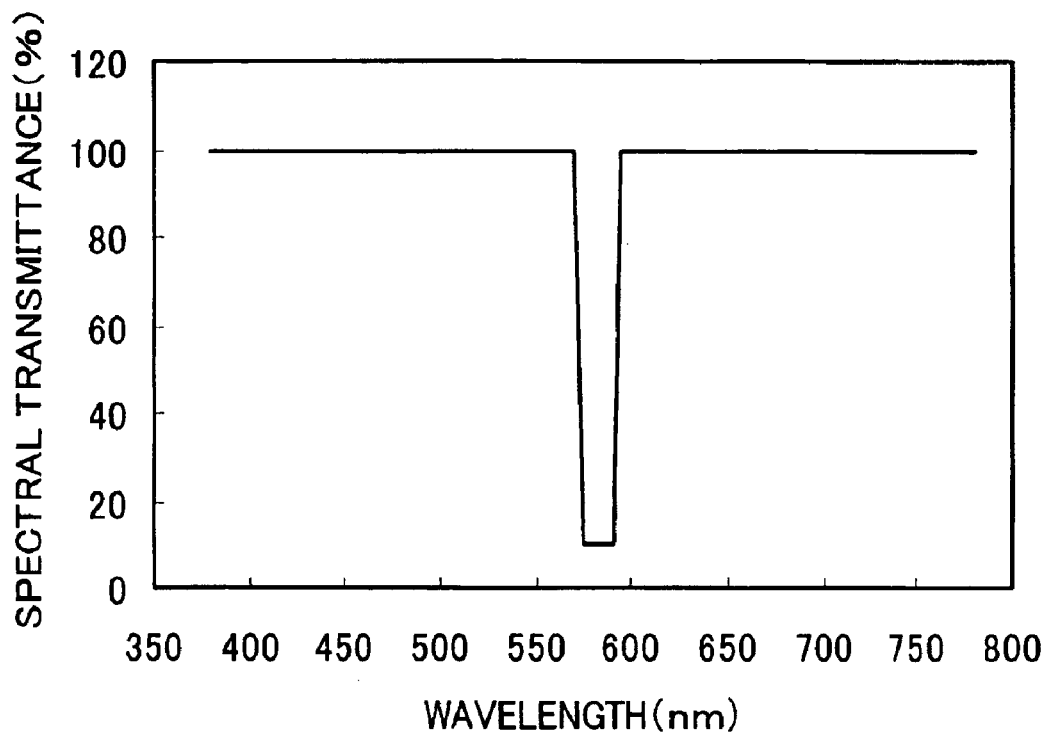
FIG. 7A is a graph showing the spectral transmittance of a filtering member F4 that may be used in an LED lamp according to yet another preferred embodiment of the present invention.
Figure 7B:
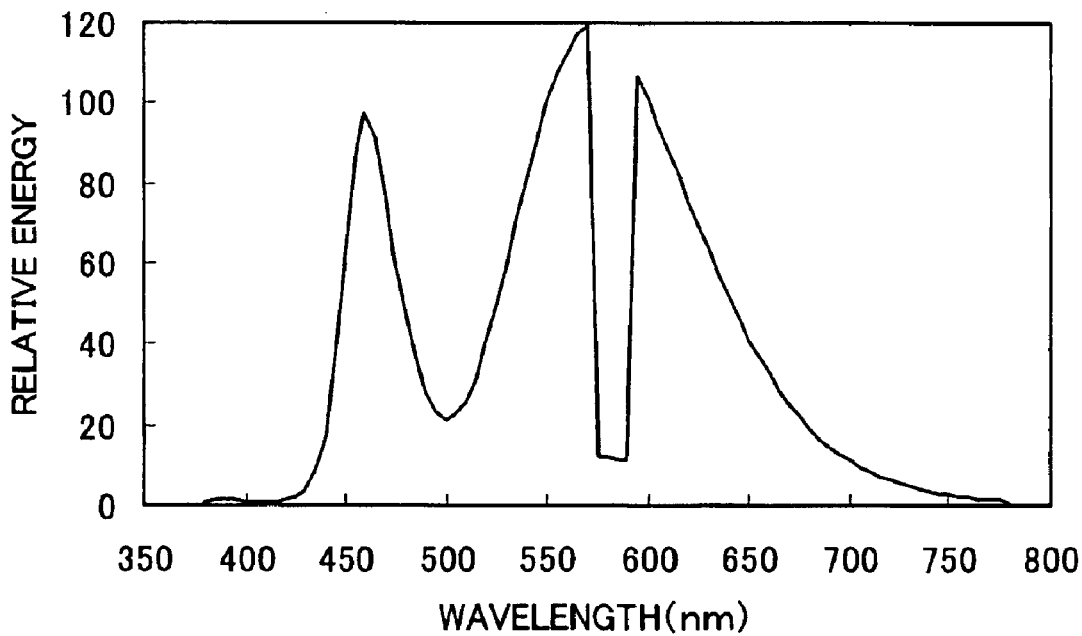
FIG. 7B is a graph showing the spectral distribution of light emitted from the LED lamp including the filtering member F4.

Next, another filtering member F4 will be described with reference to FIGS. 7A and 7B. FIG. 7A shows the spectral transmittance of the filtering member F4, and FIG. 7B shows the spectral distribution of light emitted from an LED lamp including the filtering member F4.

As can be seen from FIG. 7A, the spectral transmittance of the filtering member F4 in the wavelength subrange of 575 nm to 590 nm was just approximately 10% of the spectral transmittance thereof in the other wavelength subranges (e.g., at a wavelength of 510 nm). When such a filtering member F4 was used, the average color rendering index Ra significantly increased to 82 and the luminous flux was approximately 80% of the luminous flux obtained by using no filtering members. To maintain sufficient utility in practice, the maximum allowable decrease in the luminous flux of an LED lamp resulting from the increase in the average color rendering index Ra thereof would be approximately 80%. That is to say, the luminous flux should not decrease by more than 80%.

In this manner, by using a filtering member that has its spectral transmittance decreased by as much as 90% in the wavelength subrange of 575 nm to 590 nm from its spectral transmittance in the other wavelength subranges (e.g., at a wavelength of 510 nm), the average color rendering index Ra of the LED lamp can be increased significantly. However, the spectral transmittance in the wavelength subrange of 575 nm to 590 nm should not decrease by more than 90% because the decrease in the luminous flux would exceed its allowable range in that case.

Filtering Member F5

Figure 8A:
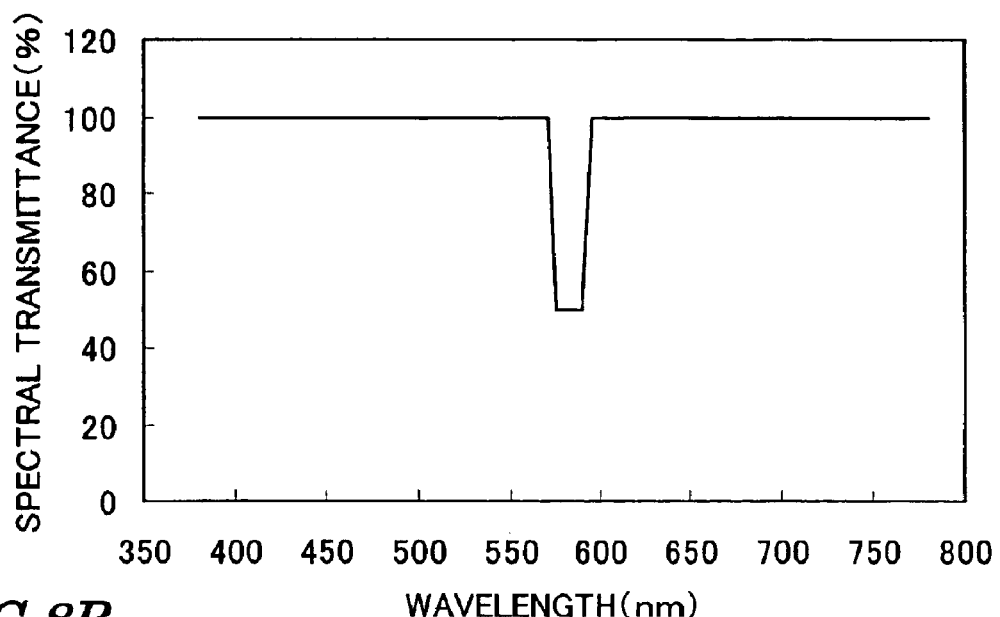
FIG. 8A is a graph showing the spectral transmittance of a filtering member F5 that may be used in an LED lamp according to yet another preferred embodiment of the present invention.
Figure 8B:
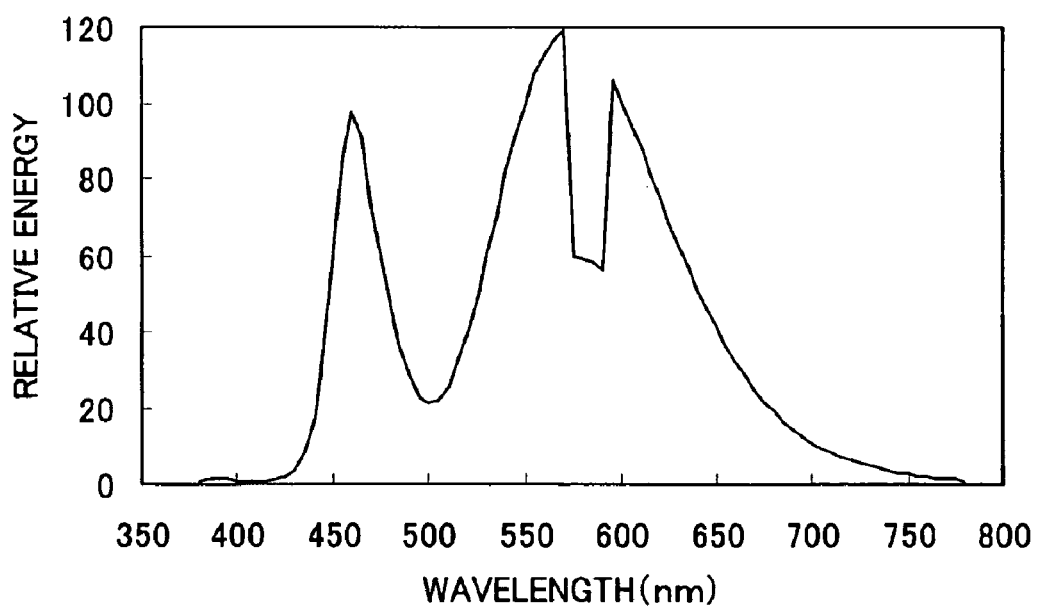
FIG. 8B is a graph showing the spectral distribution of light emitted from the LED lamp including the filtering member F5.

Next, another filtering member F5 will be described with reference to FIGS. 8A and 8B. FIG. 8A shows the spectral transmittance of the filtering member F5, and FIG. 8B shows the spectral distribution of light emitted from an LED lamp including the filtering member F5.

As can be seen from FIG. 8A, the spectral transmittance of the filtering member F5 in the wavelength subrange of 575 nm to 590 nm was approximately 50% of the spectral transmittance thereof in the other wavelength subranges (e.g., at a wavelength of 510 nm).

When such a filtering member F5 was used, the average color rendering index Ra of the LED lamp increased to 74 and the luminous flux thereof was approximately 90% of the luminous flux obtained by using no filtering members. In this manner, if the decrease in the luminous flux of an LED lamp resulting from the increase in the average color rendering index Ra thereof is within 10%, then sufficient utility can be maintained in actual use.

As described above, if the emission of an LED lamp is filtered with a filtering member that is designed such that the spectral transmittance thereof is lower in at least a portion of the wavelength range of 510 nm to 605 nm than in the remaining visible radiation range, then the average color rendering index Ra can be increased.

The particular wavelength subrange to selectively decrease the spectral transmittance from the value in the other wavelength subranges is more preferably from 550 nm to 590 nm. By using a filtering member, of which the spectral transmittance in this wavelength subrange is approximately 10% to 95% of the spectral transmittance in the other wavelength subranges, the average color rendering index Ra can be increased with the luminous flux maintained at a required level. Specifically, the spectral transmittance in the wavelength subrange of 550 nm to 590 nm is preferably controlled to approximately 50% to 95% (more preferably, approximately 70% to 95%) of the spectral transmittance in the other wavelength subranges. Also, the spectral transmittance at a wavelength of 550 nm is preferably kept at least 90% of the non-decreased spectral transmittance in the other wavelength subranges.

Hereinafter, LED lamps according to preferred embodiments of the present invention will be described with reference to the accompanying drawings. In the drawings, a number of different members, appearing on multiple sheets but having substantially the same functions, are collectively identified by the same reference numeral for the sake of simplicity.

Embodiment 1

First, an LED lamp according to a first specific preferred embodiment of the present invention will be described with reference to FIG. 9A.

Figure 9A:
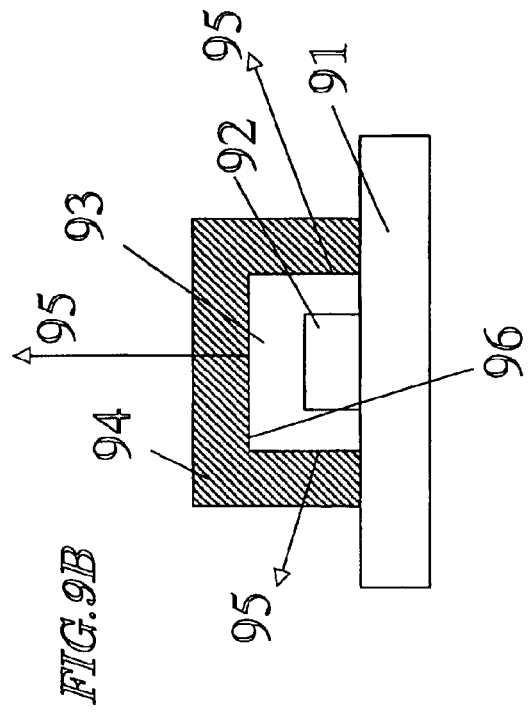
FIGS. 9A, 9B, 9C and 9D are cross-sectional views respectively illustrating LED lamps according to first, second, third and fourth specific preferred embodiments of the present invention.

As shown in FIG. 9A, the LED, lamp preferably includes a substrate 91, an LED chip 92 bonded to the substrate 91, a resin portion 93 including a phosphor (or luminophore), and a filtering member 94.

In this preferred embodiment, the LED chip 92 is preferably flip-chip bonded to the principal surface of the substrate 91. Although not shown in FIG. 9A, interconnects are actually provided on the substrate 91 and electrically connected to the electrodes of the LED chip 92 mounted. The LED chip 92 is preferably supplied with a predetermined current or voltage from a lighting circuit (not shown) and through the interconnects on the substrate 91 to make the LED chip 92 emit the light.

The phosphor dispersed in the resin portion 93 absorbs, and is excited by, the emission of the LED chip 92, thereby producing fluorescence. The light produced from the phosphor preferably has a longer wavelength than the emission of the LED chip 92. For example, when a blue LED chip is used as the LED chip 92, $(Y.Sm)_3$, $(Al.Ga)_5O_{12}:Ce$ or $(Y_{0.39}Gd_{0.57}Ce_{0.03}Sm_{0.01})_3Al_5O_{12}$ can be used effectively as the phosphor. By using such a phosphor, part of the blue ray emitted from the LED chip 92 can be transformed into a yellow ray and the resultant illumination light looks almost white overall.

In this preferred embodiment, the resin portion 93 preferably has a side surface, which is separated from another surface (not shown) that can reflect the outgoing light of the resin portion 93. More specifically, the resin portion 93 is preferably formed in a cylindrical shape so as to have a diameter longer than the diagonals of the LED chip 92 and be higher than the LED chip 92. The side surface of the resin portion 93 is preferably a curved surface that surrounds the side surfaces of the LED chip 92. As used herein, the "surface that can reflect the outgoing light of the resin portion 93" is typically a reflective surface of a reflective member that is provided specially for the purpose of reflection but may also be a surface of any other member.

Figure 10:
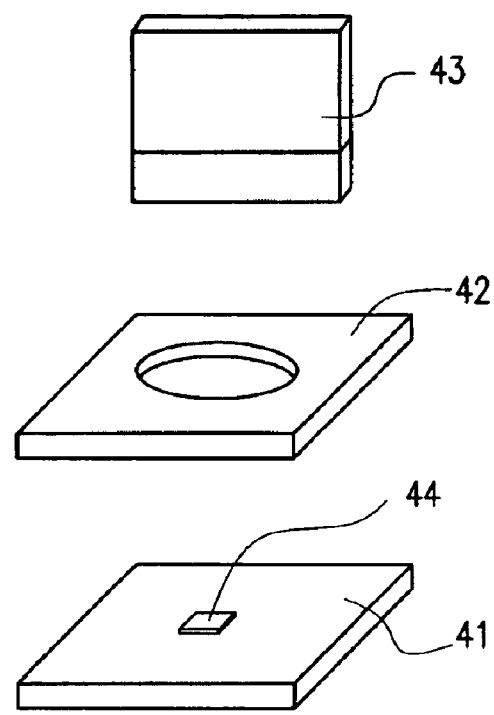
FIG. 10 is a perspective view showing an exemplary method of forming the cylindrical resin portion (wavelength converting portion) shown in FIG. 9.

The resin portion 93 may be formed as shown in FIG. 10, for example. More specifically, first, a substrate 41 on which an LED chip 44 has been mounted is preferably prepared. In this preferred embodiment, the LED chip 44 is preferably flip-chip bonded to the principal surface of the substrate 41. Next, a plate 42 with a cylindrical hole (opening) is brought into close contact with the principal surface of the substrate 41. Thereafter, a resin liquid including the phosphor is poured into the cylindrical hole. The plate 42 preferably has a thickness of 0.02 mm to 1.1 mm. The diameter of the hole is preferably longer (e.g., about 0.8 mm) than the diagonals (of 0.3 mm to 1.0 mm, for example) of the LED chip 44.

After the resin liquid has been poured into the hole of the plate 42, the excessive part of the resin liquid over the upper surface of the plate 42 is flattened with a squeeze 43 and then the resin liquid is thermally set. Thereafter, the plate 42 is removed from over the substrate 41, thereby obtaining a cylindrical resin portion that covers the LED chip 44 entirely.

The filtering member 94 of this preferred embodiment is provided outside of the resin portion 93 and covers the resin portion 93 so as to receive the outgoing light of the resin portion 93. The filtering member 94 preferably exhibits a lower spectral transmittance in at least a portion of the wavelength range of 550 nm to 605 nm than in the other wavelength subranges.

In this preferred embodiment, the filtering member 94 may be made of any material as long as the filtering member 94 can exhibit such a filtering characteristic. For example, the filtering member 94 may be made of a resin because a resin is a relatively inexpensive material. Among other things, a silicone resin is particularly preferred considering its rich flexibility and sufficiently high resistance to thermal stress. It should be noted that such a resin may be provided with the filtering characteristic by mixing a powder of an additive such as neodymium (preferably a neodymium oxide or any other suitable neodymium compound) with the material (e.g., a resin) of the filtering member. For example, by adding about 0.2 wt % of Nd powder with a mean particle size of about 7 $\mu$m to a resin, a spectral absorptivity of approximately 10% is achieved. Instead of using a material with light absorbing properties, a transparent member covered with either a multilayer interference film or a chemical coating may be used as the filtering member of this preferred embodiment.

Figure 14:
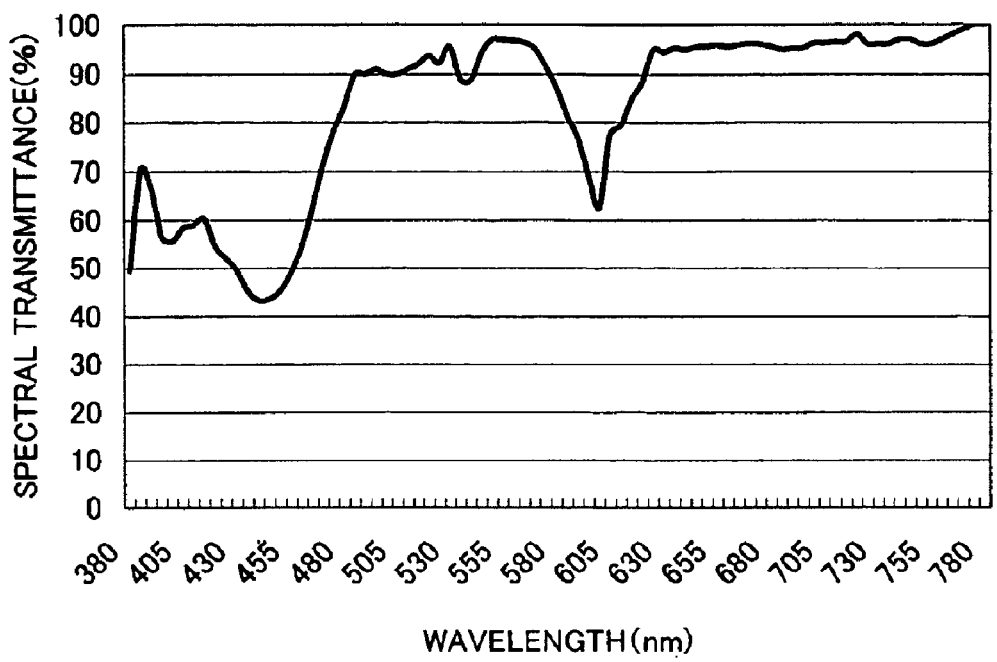
FIG. 14 is a graph showing the spectral transmittance characteristic of neodymium oxide.

FIG. 14 is a graph showing the spectral transmittance characteristic of neodymium oxide. As can be seen from FIG. 14, the spectral transmittance of the neodymium oxide decreases in the wavelength subrange of 550 nm to 605 nm to less than 70% of its maximum value. That is to say, the neodymium oxide exhibits a spectral absorptivity of more than 30% at a wavelength of 600 nm.

The emission of the LED chip 92 excites the phosphor in the resin portion 93, thereby making the phosphor produce fluorescence. In FIGS. 9A through 9D, the emission of the LED chip 92 and the fluorescence produced by the phosphor are schematically indicated by the arrows with the reference numeral 95. Also, the emission and fluorescence will be collectively referred to herein as "light rays" 95.

Figure 2:
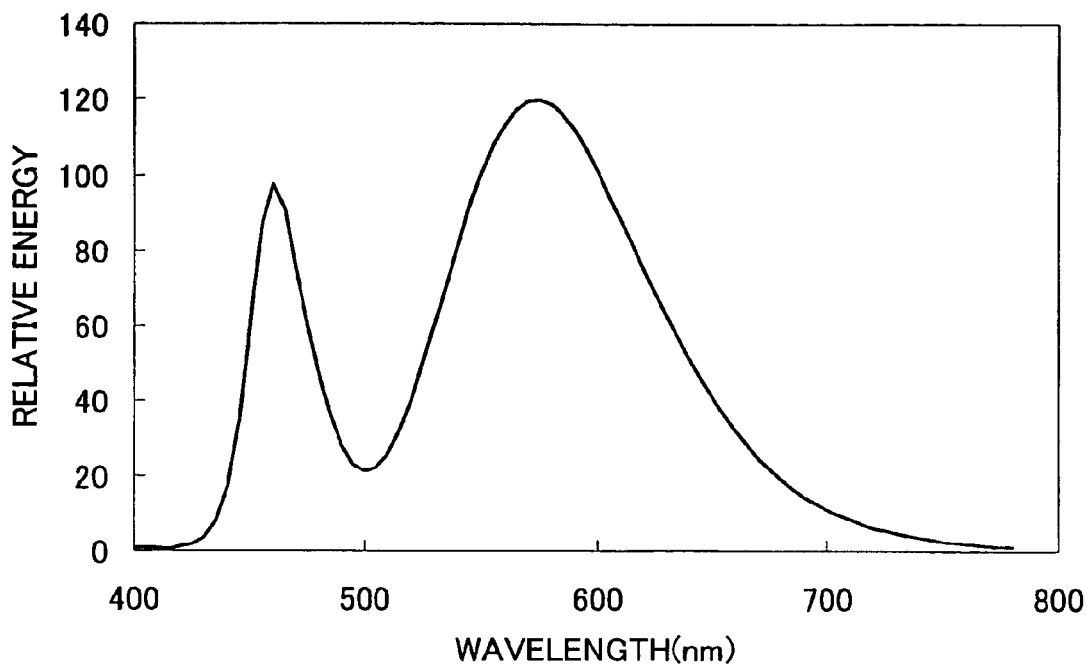
FIG. 2 is a graph showing the spectrum of the emission of an LED chip.

The light rays 95 may have a spectral distribution such as that shown in FIG. 2, for example. However, while being transmitted through the filtering member 94, the light rays may be transformed into light rays with a spectral distribution such as that shown in FIG. 8B. As a result, the average color rendering index Ra increases for the reasons described above.

Each of FIGS. 9A through 9D illustrates the single LED chip 92 that has been bonded to the substrate 91. Alternatively, multiple LED chips 92 may also be bonded onto the substrate 91. In that case, each of those LED chips 92 may be covered with the filtering member 94 separately or all of those LED chips 92 may be covered with the same filtering member 94. This statement will apply to any of the preferred embodiments of the present invention to be described below.

Embodiment 2

Figure 9B:
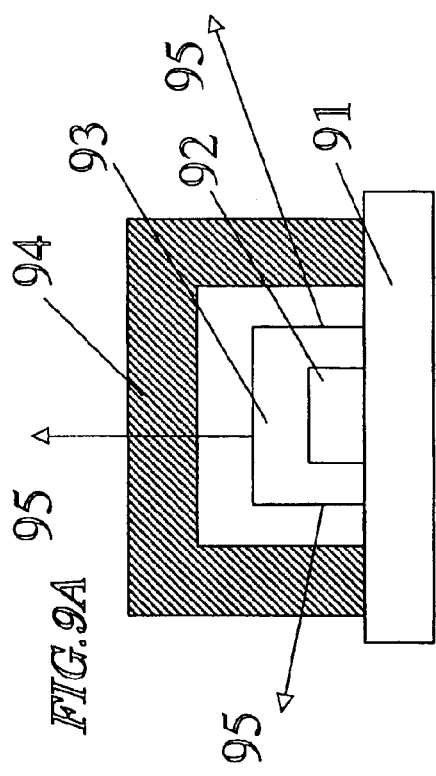

Hereinafter, an LED lamp according to a second specific preferred embodiment of the present invention will be described with reference to FIG. 9B. The LED lamp of this second preferred embodiment has almost the same configuration as the counterpart of the first preferred embodiment described above. In this preferred embodiment, however, the resin portion 93 and the filtering member 94 are arranged differently from the first preferred embodiment. Specifically, in the first preferred embodiment described above, a gap is provided between the resin portion 93 and the filtering member 94 as shown in FIG. 9A. In this second preferred embodiment on the other hand, the resin portion 93 and the filtering member 94 are in close contact with each other as shown in FIG. 9B. The reason is as follows. If the boundary 96 between the resin portion 93 and the filtering member 94 defines an interface between dissimilar materials, then the light will be refracted at the interface, thus decreasing the optical extraction efficiency. Thus, to maintain sufficiently high extraction efficiency, the filtering member 94 and the resin portion 93 are preferably made of the same resin material. Also, if in the manufacturing process step of forming the resin portion 93, the filtering member 94 is made of the same resin on the resin portion 93 that has not yet been quite cured, then the bond strength between the resin portion 93 and the filtering member 94 can be increased effectively. In that case, substantially no interface will be present between the resin portion 93 and the filtering member 94.

Embodiment 3

Figure 9C:
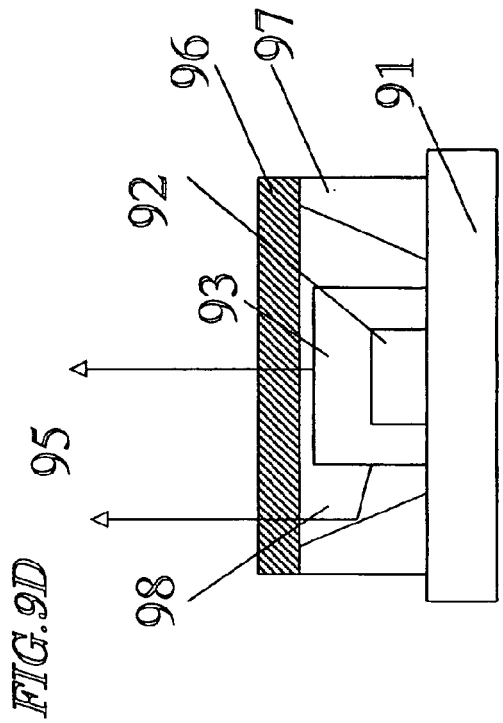

Hereinafter, an LED lamp according to a third specific preferred embodiment of the present invention will be described with reference to FIG. 9C. Unlike the LED lamp of the second preferred embodiment described above, the LED lamp of this preferred embodiment further includes a reflector 97 on the substrate 91.

The reflector 97 has at least one reflective surface for reflecting the light that has gone out of the LED chip 92 through the side surfaces thereof away from the substrate 91 (preferably perpendicularly to the principal surface of the substrate 91). This reflective surface is preferably provided so as to surround the side surfaces of the LED chip 92. If multiple LED chips 92 have been bonded to the substrate 91, then the reflector 97 preferably has multiple openings (through holes) for the respective LED chips 92. In that case, the inner walls of each opening of the reflector 97 function as the reflective surfaces. The inner walls (i.e., reflective surfaces) of each opening of the reflector 97 are preferably downwardly tapered toward the principal surface of the substrate. The cross-sectional shape of the reflective surfaces as taken on a plane that crosses the principal surface of the substrate at right angles does not have to be linear but may be curved.

The filtering member 94 of this preferred embodiment is preferably located inside of the opening of the reflector 97 and functions as a lens. As in the preferred embodiments described above, the filtering member 94 of this preferred embodiment is also preferably made of a resin.

Embodiment 4

Hereinafter, an LED lamp according to a fourth specific preferred embodiment of the present invention will be described with reference to FIG. 9D. Unlike the LED lamp of the third preferred embodiment described above, the resin portion (i.e., first resin portion) 93 of the LED lamp of this preferred embodiment is covered with a second resin portion 98 and a filtering member 96 is provided on the reflector 97. As described above, if an interface is present at the boundary between the first and second resin portions 93 and 98, then the optical extraction efficiency will decrease. For that reason, no definite interface is preferably defined at the boundary.

Figure 9D:
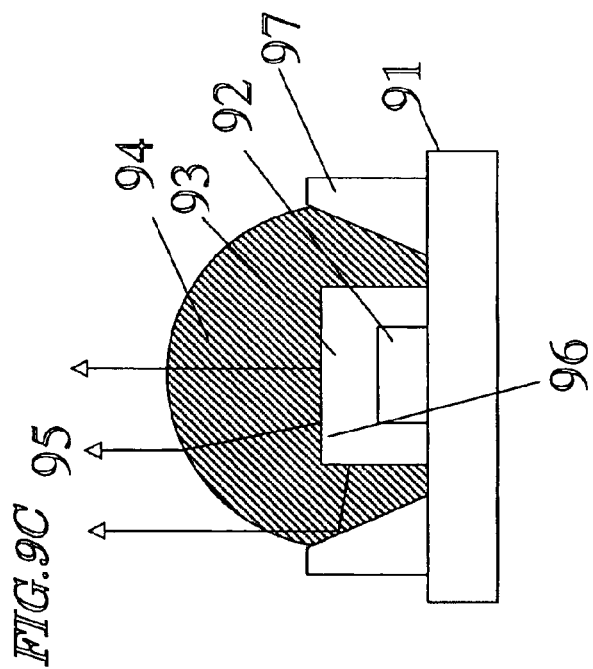

In the preferred embodiment shown in FIG. 9D, the filtering member 96 has a flat plate shape. Alternatively, the filtering member 96 may also have a convex surface functioning as a lens.

In the first through fourth preferred embodiments of the present invention described above, the filtering member is provided separately from the resin portion 93 including the phosphor. However, if the resin portion 93 further includes an additive such as Nd, then at least part of the resin portion 93 may function as the filtering member.

Figure 15:
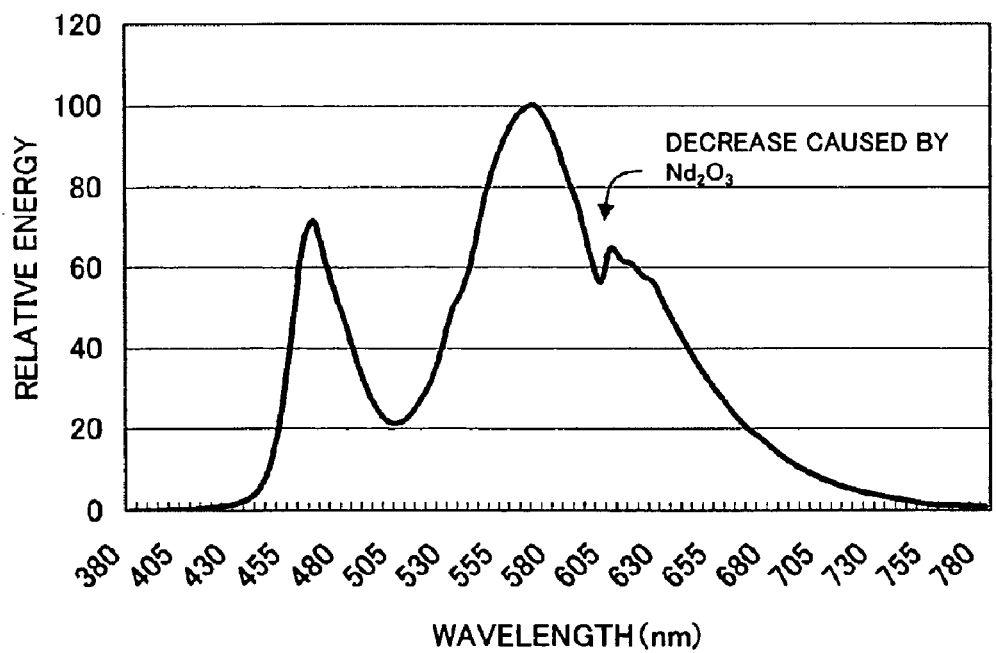
FIG. 15 is a graph showing the spectrum of light radiated from the LED lamp of the present invention when neodymium oxide exhibiting the spectral transmittance characteristic shown in FIG. 14 and a yellow phosphor were added to the resin portion 93.

FIG. 15 shows the spectrum of the light radiated from an LED lamp according to a preferred embodiment of the present invention in which not only a yellow phosphor but also neodymium oxide ($Nd_2O_3$), exhibiting the spectral transmittance characteristic shown in FIG. 14, were added to the resin portion 93. In this case, the resin portion 93 included about 1 wt % of neodymium oxide and about 65 wt % of phosphor. The resin portion 93 further included about 5.5 wt % of thixo agent with a mean particle size of about 12 nm and was formed in a cylindrical shape.

If no neodymium oxide was added to the resin portion 93, then the light radiated from the LED lamp had a spectrum such as that shown in FIG. 2. In that case, the light radiated from the LED chip 92 had a peak wavelength of about 570 nm.

As can be easily seen from FIG. 15, the relative energy decreased at a wavelength of 600 nm. The LED lamp had an average color rendering index Ra of 94, which had increased by 24. This increase was caused by the absorption of the light into the neodymium oxide included in the resin portion 93.

In this manner, even if not only the phosphor but also an Nd compound are added to the resin portion 93 that covers the LED chip 92, the effects of the present invention are achieved sufficiently.

It should be noted that neodymium is a preferred additive because the neodymium improves the color rendering property and because the neodymium added to the resin also functions as a thixo agent or a dispersant.

Embodiment 5

Figure 11:
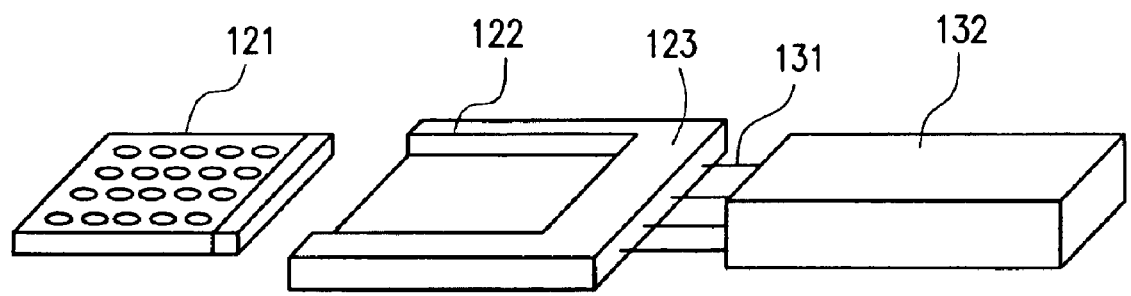
FIG. 11 is a perspective view schematically illustrating an LED lamp according to a fifth specific preferred embodiment of the present invention.

Hereinafter, an LED lamp according to a fifth specific preferred embodiment of the present invention will be described with reference to FIG. 11. FIG. 11 is a perspective view illustrating a card LED lamp 121 according to this preferred embodiment, a connector 123 to/from which the LED lamp 121 is attachable and removable, and a lighting circuit 132 to be electrically connected to the LED lamp 121 by way of the connector 123.

As shown in FIG. 11, the card LED lamp 121 is preferably inserted into the connector 123 through a pair of guide grooves 122. The guide grooves 122 are provided to slide the edges of the substrate of the LED lamp 121 in a predetermined direction while the LED lamp 121 is being inserted into, or removed from, the connector 123. The connector 123 includes a feeder electrode (not shown) to be electrically connected to the feeder electrode (not shown) of the card LED lamp 121, and is connected to the lighting circuit 132 via lines 131.

The LED lamp 121 includes a plurality of LED chips, which are preferably bonded to a rectangular substrate. Each of those LED chips is preferably covered with the cylindrical resin portion, which is preferably further covered with a filtering member. This filtering member is designed such that the spectral transmittance thereof becomes lower in at least a portion of the wavelength range of 550 nm to 605 nm than in the remaining visible radiation range (e.g., at a wavelength of 510 nm).

Optionally, the substrate of the LED lamp 121 may have a multilevel interconnect structure for connecting the respective LED chips to the feeder electrode. Also, a metallic reflector with multiple openings for the respective LED chips may be attached to the surface of the substrate.

In this manner, the LED lamp 121 of this preferred embodiment has a card shape, which is similar to a memory card, for example, and can be attached to, or removed from, any of various types of appliances with a connector. Accordingly, even when the LED lamp 121 that has been used in an illumination unit runs out of its life, the illumination unit can be used continuously by replacing the exhausted LED lamp 121 with a brand-new LED lamp of the same shape. Also, if multiple types of LED lamps 121 with mutually different properties are appropriately selected and fitted in an illumination unit one after another, the same illumination unit can provide various types of illumination lights.

Figure 12:
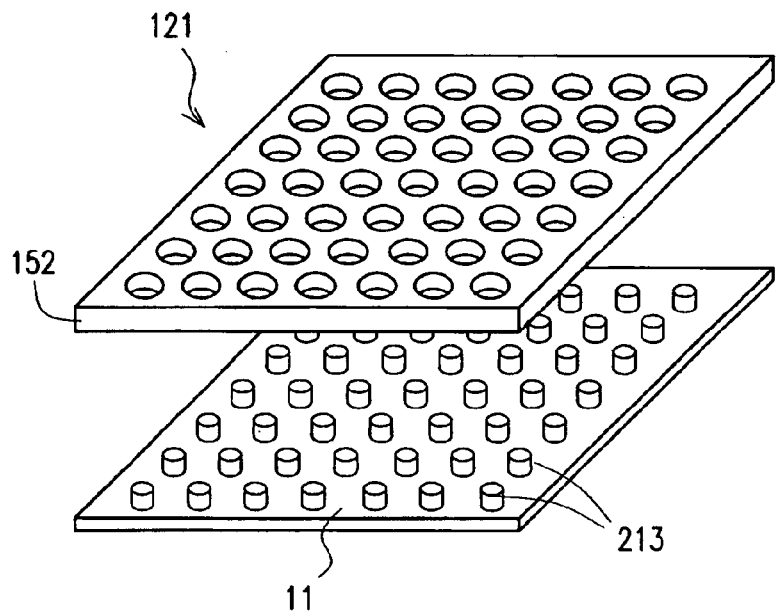
FIG. 12 is an exploded perspective view of a card LED lamp.
Figure 13:
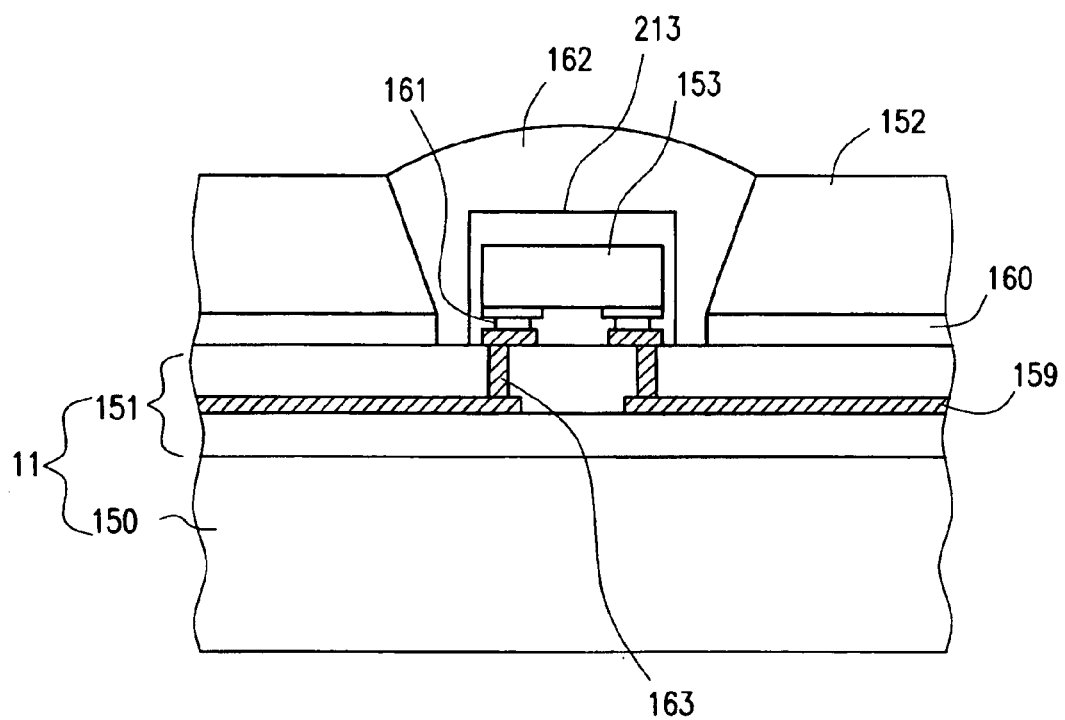
FIG. 13 is a cross-sectional view illustrating a portion of the card LED lamp shown in FIG. 12 including an LED chip.

Next, the configuration of the card LED lamp 121 of this preferred embodiment will be described in further detail with reference to FIGS. 12 and 13. FIG. 12 is an exploded perspective view of the card LED lamp 121. FIG. 13 is a cross-sectional view illustrating a portion of the card LED lamp 121 including an LED chip.

Referring to FIG. 12, the LED lamp 121 of this preferred embodiment preferably includes a plurality of cylindrical resin portions 213, which are arranged in matrix on a substrate 11. Although not shown in FIG. 12, each of the resin portions 213 includes an LED chip that has been molded with the resin. As described above, a phosphor is preferably dispersed in the cylindrical resin portion 213 to transform the emission of the LED chip into light with a longer wavelength.

A reflector 152 with multiple openings surrounding the respective cylindrical resin portions 213 is preferably attached to the surface (i.e., the mount-side surface) of the substrate 11. The inside surface of each opening of the reflector 152 functions as a reflective surface for reflecting the emission of the cylindrical resin portion 213.

Next, referring to FIG. 13, each LED chip 153 of this preferred embodiment is preferably flip-chip bonded to an interconnect pattern 159 of a multilayer wiring board 151, which is attached to a metal plate 150. In this case, the metal plate 150 and the multilayer wiring board 151 together make up the substrate 11. The LED chip 153 is covered with the resin portion 213 including the phosphor. And this resin portion 213 is further covered with a second resin portion 162 functioning as a lens. This second resin portion 162 preferably includes 0.01% to 30% (more preferably at least 0.1%) of neodymium as an additive and may function as a filtering member just like the counterpart 94 shown in FIG. 9C.

In this preferred embodiment, the multilayer wiring board 151 includes a two-layered interconnect pattern 159, in which interconnects belonging to the two different layers are connected together by way of via metals 163. Specifically, the interconnects belonging to the upper layer are connected to the electrodes of the LED chip 153 via Au bumps 161. The interconnect pattern 159 may be made of copper, nickel, aluminum, or an alloy mainly composed of these metals, for example.

The upper surface of the multilayer wiring board 151 having such a configuration is mostly covered with the reflector 152 but is partially exposed. A number of feeder electrodes (not shown) are provided on the exposed areas of the multilayer wiring board 151. These feeder electrodes are electrically connected to the lighting circuit of an illumination unit by way of the connector into which the card LED lamp is inserted.

In the example illustrated in FIG. 13, an underfill (stress relaxing) layer 160 is preferably provided between the reflector 152 and the multilayer wiring board 151. This underfill layer 160 can not only relax the stress, resulting from the difference in thermal expansion coefficient between the metallic reflector 152 and the multilayer wiring board 151, but also ensure electrical insulation between the reflector 152 and the upper-level interconnects of the multilayer wiring board 151.

According to this preferred embodiment, the freely attachable and removable card LED lamp can provide illumination light with a high color rendering property.

Each of the preferred embodiments of the present invention described above is an LED lamp including an LED chip that emits a blue light ray and a wavelength converting portion for transforming the blue light ray into a light ray with a longer wavelength. Alternatively, the present invention is also implementable as an LED lamp including an LED chip that emits an ultraviolet ray and a wavelength converting portion for transforming the ultraviolet ray into a light ray with a longer wavelength.

Figure 1:
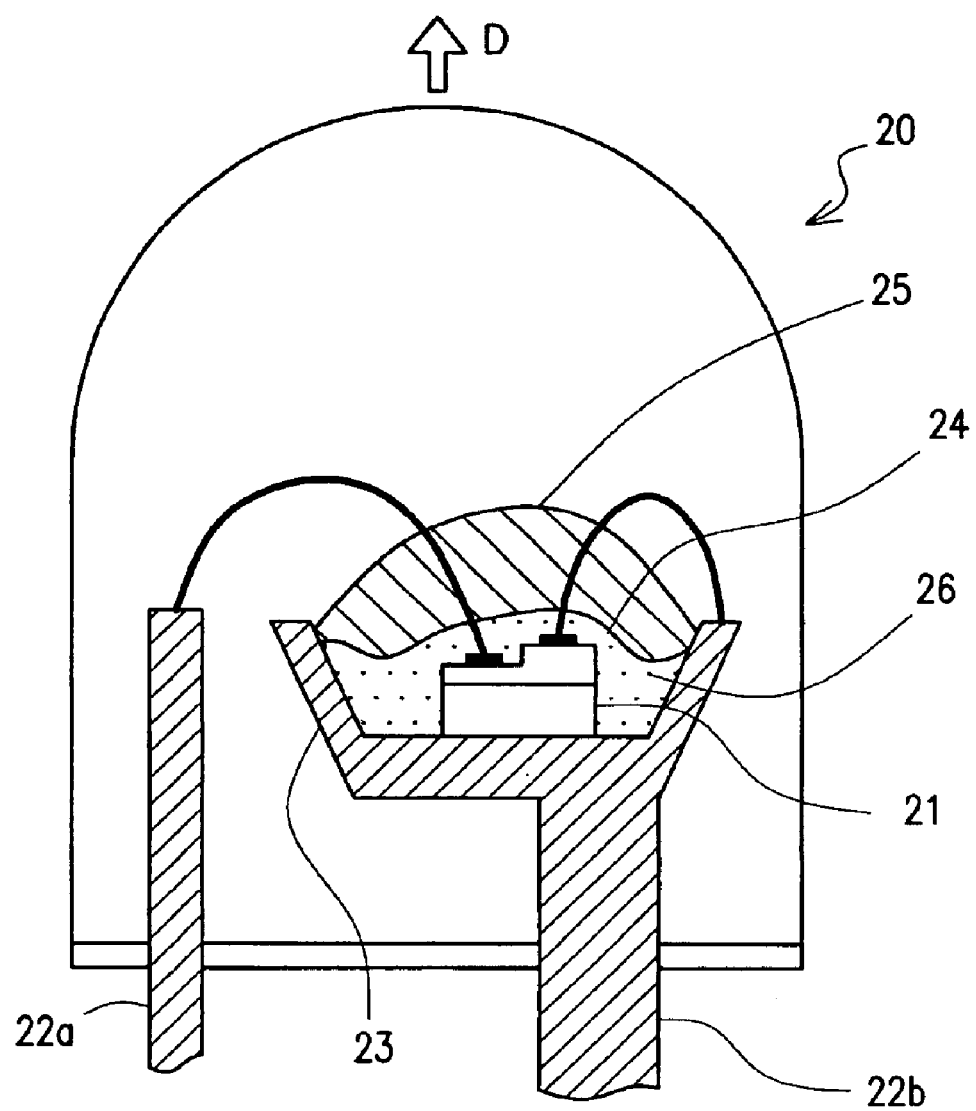
FIG. 1 is a cross-sectional view illustrating a conventional LED lamp.

Furthermore, in the preferred embodiments described above, the filtering member is fixed onto the substrate on which the LED chip has been bonded. However, the present invention is in no way limited to such specific preferred embodiments. For example, the filtering member may also be provided for the connector 123 shown in FIG. 11. The point is the present invention only requires that the filtering member be provided at such a position as to filter the illumination light that has gone out of the LED chip and wavelength converting portion of the LED lamp. Optionally, the present invention is also applicable for use even in an LED lamp having the bullet package shown in FIG. 1. In that case, at least part of the second resin portion 25 or glass housing may function as the filtering member.

The present invention is effectively applicable for use in various types of illumination sources that can replace the conventional illumination sources utilizing electric discharge.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. An LED lamp comprising:
    at least one LED chip, the emission of which has a peak wavelength in the range of 400 nm to 490 nm; and
    a wavelength converting portion including a phosphor for transforming the emission of the LED chip into light having a longer wavelength than that of the emission,
    wherein the LED lamp further includes filtering means, which is designed such that the spectral transmittance thereof becomes lower in at least a portion of the wavelength range of 550 nm to 605 nm than in the remaining visible radiation range.

2. The LED lamp of claim 1, wherein the LED chip is mounted on a substrate.

3. The LED lamp of claim 2, wherein the LED chip is flip-chip bonded to the substrate.

4. The LED lamp of claim 1, wherein the wavelength converting portion is made of a resin.

5. The LED lamp of claim 4, wherein the wavelength converting portion has a cylindrical shape and covers the LED chip entirely.

6. The LED lamp of claim 4, the wavelength converting portion is further covered with another resin.

7. The LED lamp of claim 1, wherein the filtering means is arranged so as to cover the wavelength converting portion.

8. The LED lamp of claim 1, wherein the filtering means is made of a resin.

9. The LED lamp of claim 1, wherein the wavelength converting portion and the filtering means are both made of the same resin and substantially no interface is present between the wavelength converting portion and the filtering means.

10. The LED lamp of claim 4, wherein the wavelength converting portion made of the resin includes an Nd compound, and functions as the filtering means as well.

11. The LED lamp of claim 10, wherein the wavelength converting portion has a cylindrical shape and covers the LED chip entirely.

12. The LED lamp of claim 10, further comprising a reflector that has an opening surrounding the wavelength converting portion.

13. The LED lamp of claim 1, wherein the filtering means is designed such that the spectral transmittance thereof becomes lower in the wavelength subrange of 575 nm to 590 nm than in the remaining visible radiation range.

14. The LED lamp of claim 13, wherein the spectral transmittance of the filtering means in the wavelength subrange of 575 nm to 590 nm is controlled to be 10% to 95% of the spectral transmittance thereof in the remaining visible radiation range.

15. The LED lamp of claim 1, wherein the spectral transmittance of the filtering means is controlled so as to increase the average color rendering index Ra of the LED lamp.

16. The LED lamp of claim 1, wherein the LED lamp has a card shape so as to be attachable to, or removable from, an illumination unit including a lighting circuit.

* * * * *

UNITED STATES PATENT AND TRADEMARK OFFICE
CERTIFICATE OF CORRECTION

| | | |
|---|---|---|
| PATENT NO. | : 6,940,101 B2 | Page 1 of 1 |
| APPLICATION NO. | : 10/721981 | |
| DATED | : September 6, 2005 | |
| INVENTOR(S) | : Tadashi Yano et al. | |

It is certified that error appears in the above-identified patent and that said Letters Patent is hereby corrected as shown below:

<u>Column 14</u>

Line 27, after "The LED lamp of claim 4,", insert -- wherein --.

Signed and Sealed this

Fifteenth Day of August, 2006

JON W. DUDAS
*Director of the United States Patent and Trademark Office*